United States Patent [19]

Zhong

[11] Patent Number: 5,818,246
[45] Date of Patent: Oct. 6, 1998

[54] AUTOMATIC MULTI-PROBE PWB TESTER

[76] Inventor: George Guozhen Zhong, 280 Sydney Street South Apt. B 6, Kitchener, Ontario, Canada, N2G 3V9

[21] Appl. No.: 643,957

[22] Filed: May 7, 1996

[51] Int. Cl.$^6$ .................................................. G01R 31/02
[52] U.S. Cl. .......................................... 324/754; 324/538
[58] Field of Search ................................ 324/72.5, 73.1, 324/158.1, 754, 760, 761, 500, 537, 538, 639, 95; 439/482

[56] References Cited

U.S. PATENT DOCUMENTS

| | | | |
|---|---|---|---|
| 4,138,643 | 2/1979 | Beck et al. | 324/754 |
| 4,565,966 | 1/1986 | Burr et al. | 324/525 |
| 4,675,600 | 6/1987 | Gergin | 324/754 |
| 4,749,994 | 6/1988 | Black | 324/754 |
| 4,829,238 | 5/1989 | Goulette et al. | 324/750 |
| 5,113,133 | 5/1992 | Conti et al. | 324/754 |
| 5,124,660 | 6/1992 | Cilingiroglu | 324/538 |
| 5,218,294 | 6/1993 | Soiferman | 324/158.1 |
| 5,473,254 | 12/1995 | Asar | 324/537 |

Primary Examiner—Vinh P. Nguyen

[57] ABSTRACT

A new structure of a test apparatus (tester) for detecting shorts and opens of a printed wiring board and an associated automatic test method. The tester has means for injecting signals into conductors of a printed wiring board under test (BUT) and a large number of integrated solenoid-actuated probes which are arranged in a two-dimensional array for sampling signals from the conductors of the BUT. The signals are sampled from the conductors by the integrated solenoid-actuated probes in a row by row scanning sequence following a grid pattern of the BUT. Each of the probes needs only to sample signals from the conductors in a small portion of the BUT.

4 Claims, 5 Drawing Sheets 2 cover plate, 3 top excitation plate, 4 bottom excitation plate, 5 PWB under test, 6 fixture, 13 sensor board, 14 ground plate, 15 brass tube frame, 16 cap, 17 insulation ring, 18 iron ring, 19 spring, 20 push-on connector, 21 plastic bearing, 22 probe, 23 positioning pin, 24 solenoid, 25 bolt, 26 insulation washer, 27 dielectric coating, 28 plastic tube, 29 case wall, 30 nut. 31 solenoid-actuated probes, 32 iron tube frame, 33 small holes.

1 probe assembly case, 2 cover plate, 3 top excitation plate, 4 bottom excitation plate, 5 PWB under test, 6 fixture, 7 base, 8 frame.

9 brace, 10 z table, 11 y table, 12 x table.

2 cover plate, 3 top excitation plate, 4 bottom excitation plate, 5 PWB under test, 6 fixture, 13 sensor board, 14 ground plate, 15 brass tube frame, 16 cap, 17 insulation ring, 18 iron ring, 19 spring, 20 push-on connector, 21 plastic bearing, 22 probe, 23 positioning pin, 24 solenoid, 25 bolt, 26 insulation washer, 27 dielectric coating, 28 plastic tube, 29 case wall, 30 nut, 31 solenoid-actuated probes, 32 iron tube frame, 33 small holes.

short open

AUTOMATIC MULTI-PROBE PWB TESTER

BACKGROUND OF THE INVENTION

This invention relates to a new structure of a test apparatus (tester) and a method generally for automatically testing a printed wiring board (PWB or PCB for printed circuit board) including electrically conductive paths, terminals, parts and surfaces whose electrical and physical continuity and conformance to a known standard or specification is to be verified, more particularly, for detecting shorts and opens of the PWB.

Detecting shorts and opens of PWBs is an important part of total quality assurance operations in the PWB manufacturing process. Testers available on the market for detecting shorts and opens of PWBs include two basic types: contacting type and noncontacting type. A flying-probe or moving-probe tester belongs to contacting type and usually has two probes which can move independently in x and/or y directions in a plane parallel to the board under test (BUT). To detect opens of a conductor (net) on the PWB, the two probes have to contact every terminals (end points) of the conductor pair by pair and measure the continuity. To detect shorts of conductors is not a straight forward task: first, all of the adjacent conductors have to be found out; then the two probes have to test the terminals of every adjacent conductors pair by pair. It is obvious that this test process is very time consuming and inefficient. Some flying-probe testers use more than two movable probes to increase test speed, but the number of the movable probes in such testers is limited by cost and space. Each movable probe requires at least one expensive high precision feedback-controlled drive or servo positioning system, therefore, it is not practical to integrate a large number of the movable probes in a single unit for testing an individual PWB.

Another type of contacting testers use multiple probes in a "bed of nails" test fixture, which have no drawback of the flying-probe testers, but have a limitation of testing fine pitch PWBs because the probes of small test center are fragile and have to be replaced often in production environments. This type of testers require considerably long lead time and high cost to build test fixtures.

Noncontacting testers use visual-band imaging and x-ray imaging techniques for detecting shorts and opens. However, the testers using visual-band imaging can not be used for inspection of multi-layer boards. The testers using x-ray imaging can assist human visual inspection of multi-layer boards, but the test process is not automatic.

Using capacitance measurement method to detect shorts and opens of the BUT have been previously proposed by several inventors because it can significantly reduce the test time. The basic approach of this method is to measure the capacitances between conductor nets of the BUT and a reference plate. The reference plate can be power and ground planes inside the BUT or a conductive plate outside the BUT. This method was described in "Continuity Testing by Capacitance" by Robert W. Wedwick, published in Circuits Manufacturing, November 1974, pages 60 and 61, in U.S. Pat. No. 3,975,680 issued to Larry J. Webb, and in U.S. Pat. No. 4,565,966 issued to Robert P. Burr et al. In L. J. Webb's invention a manually operated probe and a reference plate are placed on the same side of the BUT and the probe extends through an aperture in the reference plate to contact BUT and sample signals. In R. P. Burr's invention a flying-probe tester is utilized for measuring coupling capacitances between conductor nets of the BUT and a reference plate; the reference plate outside of the BUT can only be placed on the opposite side of the flying probes. The capacitance measurement method proposed by these two inventors is called "one reference plate" method in the following description because the reference plate is placed on only one side of the BUT. As development of the printed circuit technology requires higher and higher circuit wiring density, conductors of the BUT become finer and finer, coupling capacitances between the conductors and the reference plate become smaller and smaller, it is therefore more and more difficult to obtain a reliable measurement of these small capacitances using the "one reference plate" method at a fast speed.

I have found that one of the disadvantages of the "one reference plate" method proposed in the past is that it may not be able to effectively detect faults in small conductor lines of the BUT. For example, assuming that there are two conductor nets in a BUT, called net 1 and net 2. Net 1 has a long conductor line on side A of the BUT and a via which connects the long conductor line to a small pad on side B. Net 2 only runs on side A of the BUT. In the first case, the effective way to test continuity of the via using the "one reference plate" method is to place the reference plate on side A of the BUT while sampling signals from the small pad connected by the via on side B. Only by doing so can the reference plate be placed in close proximity to the large surface area of net 1 so as to increase the coupling capacitance between the reference plate and net 1. In the second case, the effective way to detect opens of net 2 is to place the reference plate on side A of the BUT while sampling signals from every terminals of net 2 on the same side. It is seen from this example that in the first case the reference plate and the probe must be placed on the opposite sides of the BUT, therefore, L. J. Webb's tester can not meet the requirement; in the second case the reference plate and the probe must be placed on the same side of the BUT, therefore, R. P. Burr's flying-probe tester can not meet the requirement.

From the preceding overview, the disadvantages of the testers and methods proposed in the past for detecting shorts and opens of PWBs are summarized as follows:

1. Use of flying-probe testers with the resistance or capacitance measurement method for detecting shorts and opens of PWBs is time consuming and inefficient because too few flying probes can be used in a tester. Although the test time can be significantly reduced by using capacitance measurement method, the flying-probe testers can not ultimately take advantages of this method.

2. Use of flying-probe testers with the "one reference plate" method may not be able to effectively detect faults in fine conductor lines of the BUT.

3. Use of "bed of nails" testers requires considerably long lead time and high cost to build test fixtures and have a limitation of testing fine pitch PWBs.

A number of probe apparatuses for testing PWBs have also been proposed in the past, for example, in U.S. Pat. No. 4,675,600 issued to Gergin, in U.S. Pat. No. 5,113,133 issued to Conti et al., and in U.S. Pat. No. 5,473,254 issued to Asar. Although each of the designs of these probe apparatuses has a particular application focus, the indirect driving means of the proposed probe apparatuses, including the rotary solenoid (or motor) and the mechanism for transferring rotary motion of the rotary solenoid (or motor) to linear motion of the probe, are unavoidably characterized by large inertia, friction, size, and power consumption. Therefore, the designs of the proposed probe driving means are not suitable for an integrated probe assembly with a large number of high speed solenoid-actuated probes.

The first objective of the present invention is to provide a tester and a method capable of detecting shorts and opens of PWBs at a much faster speed than flying-probe testers and without disadvantages of the "bed of nails" testers.

The second objective of the present invention is to provide an embodiment design of an integrated probe assembly including a large number of high speed solenoid-actuated probes as an alternative to the flying probes or "bed of nails" fixtures.

The third objective of the present invention is to improve the "one reference plate" method by implementing a "two excitation plates" method so as to improve the performance of the tester for detecting faults in fine conductor lines of the BUT.

The fourth objective of the present invention is to provide a tester and a method capable of detecting shorts and opens of not only bare but also loaded PWBs based on measurements of AC or DC signals from the BUT.

SUMMARY OF THE INVENTION

The first objective of the present invention is achieved mainly by using an integrated probe assembly which includes a large number of integrated solenoid-actuated probes. The integrated solenoid-actuated probes are arranged in a two dimensional array, separated evenly in the x and y directions in a plane or planes parallel to the surface of the BUT, and can be operated independently in the z direction. Each of the integrated solenoid-actuated probes only sampling signals from test points in a small portion of the BUT. In assistance to achieve this objective, means are devised for injecting signals into the conductors of the BUT; motorized x-y tables are used for generating x and y relative displacements between the BUT and the integrated probe assembly; a computerized data acquisition and analysis system is used for realizing the test process of scanning and sampling and for detecting faults of the BUT. Since a large number of the integrated solenoid-actuated probes can be operated independently or simultaneously and each of them needs only to sample signals from test points in a small portion of the BUT, the tester of the present invention has a much faster test speed than the flying-probe testers. Furthermore, since the motorized x-y tables have a high resolution of displacements, the tester of the present invention has no limitation of testing fine pitch PWBs.

The second objective of the present invention is achieved by the following approaches:

1. arranging the solenoid-actuated probes in a two-dimensional array, separating them evenly in the x and y directions in a plane parallel to the surface of the BUT so that each of the probes needs only to sample signals from test points in a small portion of the BUT;
2. directly attaching an insulation ring and an iron (or magnetic-soft metal) ring to each of the probes which runs through a solenoid to drive the probe, therefore, the probe driving mechanism has low inertia, low friction, low power consumption, and is small in size;
3. using air chambers in a tubular frame of the solenoid as damping means to prevent probe bounces;
4. using a perforated plate, which can be an excitation plate, as mounting plate of the integrated solenoid-actuated probes;
5. mounting signal amplifier board(s) in close proximity to the integrated solenoids-actuated probes to shorten wiring distances between the probes and the amplifiers so as to reduce the input stray capacitances of the amplifiers;
6. placing a ground plate between the probes and the amplifiers to avoid the electro-magnetic interference.

Approaches 1 and 2 assure that a large number of the solenoid-actuated probes can be integrated in a single unit to test an individual BUT. Approaches 2 and 3 assure that each of the integrated probes can be operated independently at a high speed (as high as 100 Hz). Since the integrated solenoid-actuated probes are evenly separated from each other, the probes can be made more robust than the spring contact probes of small test centers used by the "bed of nails" fixtures and the difficulties of building the test fixture are eased. Furthermore, Approaches 4 to 6 assure that the integrated probe assembly can be used for sampling not only DC signals but also high frequency AC signals.

The third objective of the present invention is achieved mainly by using two (or more than two) excitation plates for injecting high frequency signals into the conductors of the BUT. The two excitation plates are placed on the both sides of and in close proximity to the BUT to increase coupling capacitances between conductors of the BUT and the excitation plates and, therefore, increase sensitivity of the tester for detecting faults in fine conductor lines of the BUT. In assistance to achieve this objective, at least one of the excitation plates must be perforated to allow the integrated probes to sample signals through the holes in the perforated excitation plate.

The fourth objective of the present invention are achieved by using different means for injecting signals into the conductors of the BUT. For example, AC or DC signals can be directly injected into the BUT through its ground and power lines or by other means. Although the signal injecting means, the test points, and the fault detecting criterion depend on a particular design and application, the concept of the present invention is unchanged.

These and other objects and features of the present invention will become apparent from the following description taken in conjunction with an illustrative embodiment thereof with reference to the accompanying drawings.

BRIEF DESCRIPTION OF THE DRAWINGS

In drawings which illustrate an embodiment of the invention.

Before the description of the present invention proceeds, it is to be noted that like parts are designated by like reference numerals and symbols throughout several views of the accompanying drawings.

DETAILED DESCRIPTION OF THE INVENTION

Figure 1:
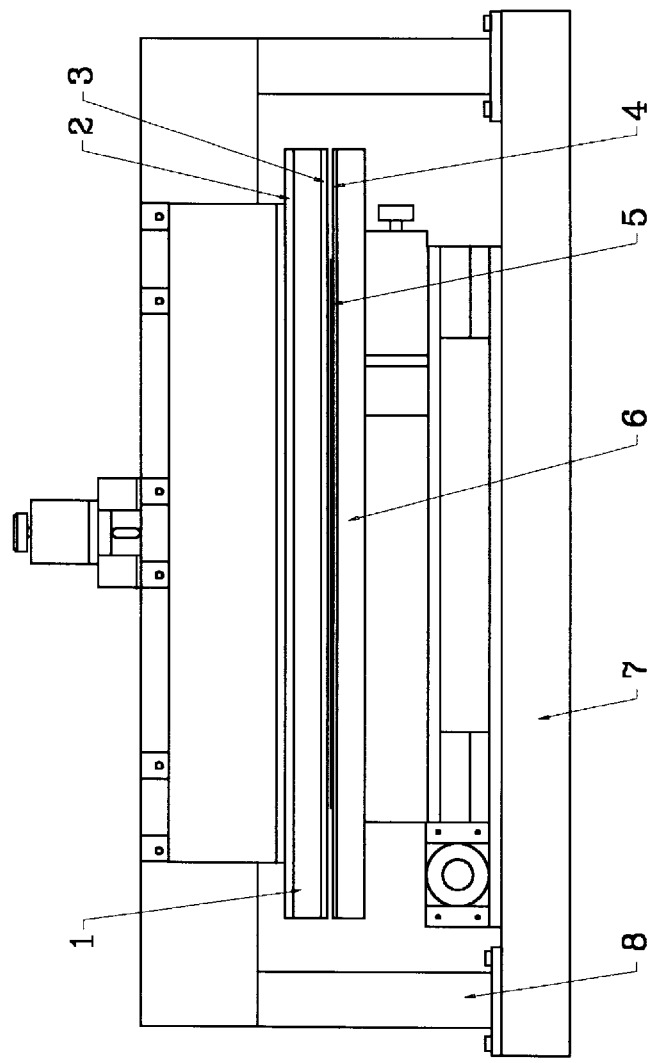
FIG. 1 is an assembly of the embodiment.
Figure 2:
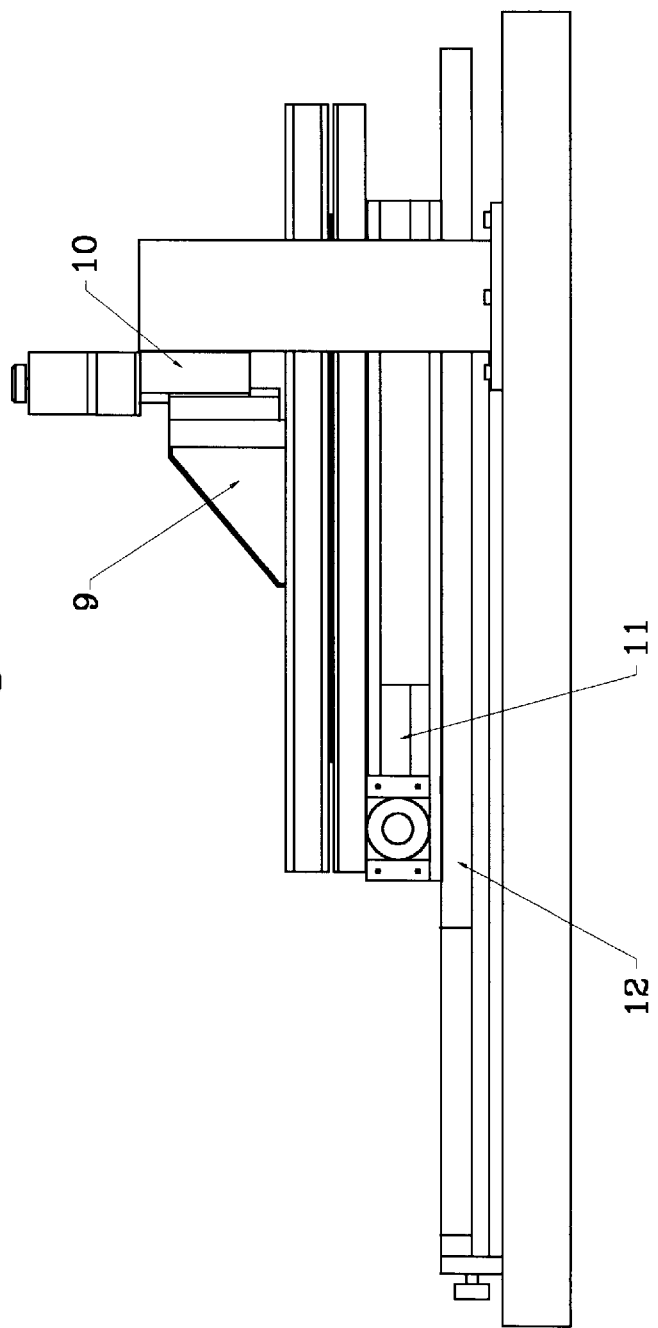
FIG. 2 is a right side view of this embodiment.

As is seen from FIG. 1 and FIG. 2, the tester comprises: a probe assembly case 1 which is held by a brace 9 mounted on a z table 10 (single axis table) which is in turn mounted on a frame 8; a top excitation plate 3 which is mounted on the bottom of the probe assembly case 1; a bottom excitation plate 4 fastened on the top of a fixture (or vacuum fixture) 6 which is mounted on the top of a y table 11 which is in turn mounted on the top of an x table 12. The fixture is electrically insulated from the bottom excitation plate. The x table 12 and the frame 8 are fixed on a base 7. A BUT 5 is loaded on the top of the bottom excitation plate 4 and under the top excitation plate 3. The top excitation plate 3 and the bottom excitation plate 4 are made of conductive material with dielectric coating 27. The integrated solenoid-actuated probes are assembled inside the probe assembly case 1. The x, y, and z tables have individually attached displacement transducers and are driven by stepping motors. The stepping motors and the electronic circuits in the probe assembly case are connected to a microcomputer control system (not shown in the Figure) to carry out the feedback motion control of the x, y, and z tables, data acquisition, and analysis process.

Figure 3:
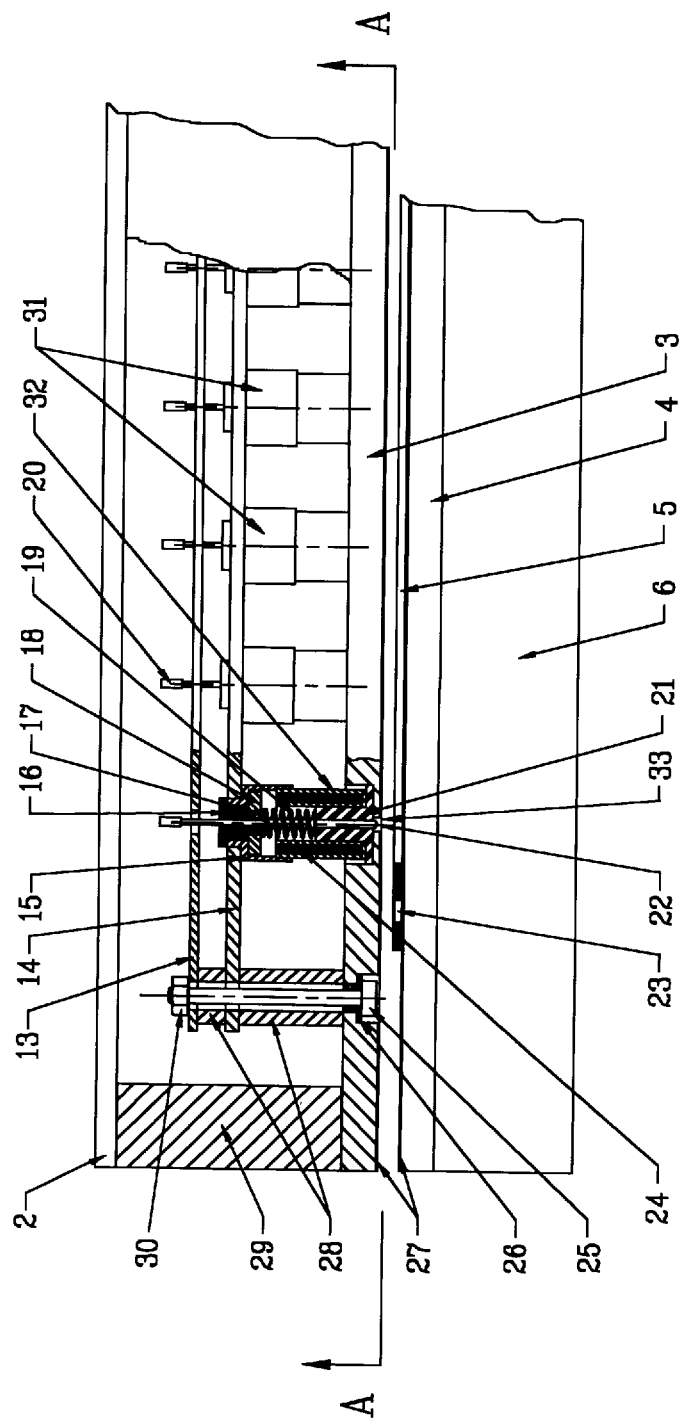
FIG. 3 shows a detailed partial view of a probe assembly case and relevant components, FIG. 4 showing the perforated small holes in a two-dimensional array on the top excitation plate is a section view of the line A—A of FIG. 3.
Figure 4:
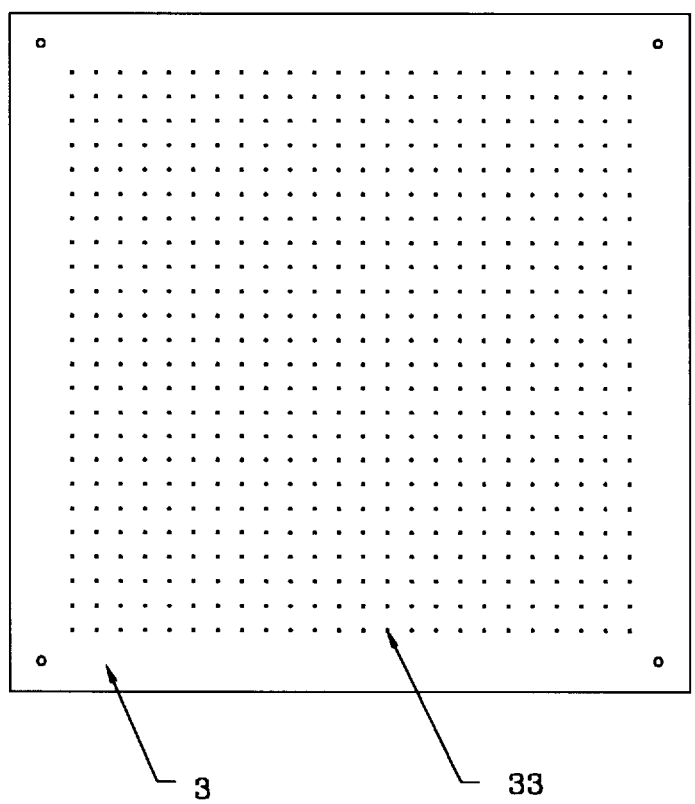

FIG. 3 shows a detailed partial view of the probe assembly case 1 and relevant components. The probe assembly case 1 has a case wall 29 and a cover plate 2 and is a housing of an integrated solenoid-actuated probe assembly including a large number of integrated solenoid-actuated probes 31 which are mounted on the top of the top excitation plated 3, a ground plate 14 assembled on the top of the integrated solenoid-actuated probes 31, and a sensor board 13 mounted on the top of the ground plate 14. The integrated solenoid-actuated probes 31 are assembled between the top excitation plate 3 and a ground plate 14 in a two-dimensional array, separated evenly from each other in the x and y directions in a plane parallel to the surface of the BUT, as shown in FIGS. 3 and 4. The top excitation plate 3 is perforated as shown in FIG. 4. The perforated small holes 33 are in alignment with probes 22, one small hole 33 for each probe 22, to allow probes 22 to contact the BUT 5 through the small holes 33 when solenoids 24 are powered. (The size of holes 33 are as small as possible to reduce the missing area of excitation, but large enough to allow the probes 22 to contact the BUT 5 through the holes 33 without contact with the top excitation plate 3.) The probe 22 is attached by an insulation ring 17 and an iron ring 18. The iron ring 18 provides driving force to the probe 22 when the solenoid 24 is powered; the insulation ring 17 provides insulation between the probe 22 and the iron ring 18. The probe 22 is made of conductive material or plastic material with one plated conductor or with two symmetrically plated conductors from the head to the tail of the probe 22. The former can be used for a preamplifier with single-ended input and the latter for a preamplifier with double-ended input. An iron tube frame 32 is used for housing the solenoid 24 and enhancing magnetic flux density of the solenoid 24. A brass or aluminum tube 15 is used for assembling the solenoid 24. The air chambers are formed inside the brass tube frame 15 between the iron tube frame 32 and a cap 16 so that the air in the chambers against the insulation ring 17 and the iron ring 18 damps the fast reciprocating motion of the probe 22 so as to prevent its bounce and stabilize its contact against the BUT when it is actuated. A plastic bearing 21 is used for guiding the probe 22 in reciprocating motion. A spring 19 is used for raising the probe 22 when the solenoid 24 is de-energized. A sensor board 13 is mounted on the top of the ground plate 14 by bolt 25, nut 30, plastic tubes 28, and insulation washer 26 and used for signal pre-amplification, data acquisition, and control of the integrated solenoid-actuated probes. The ground plate 14 screens the sensor board 13 from the top excitation plate 3 to avoid the electromagnetic interference. The iron tube frames 32 and the brass tube frames 15 assembled by the ground plate 14 also screen the probes 22 from the top excitation plate 3. A push-on connector 20 is used for wiring from the tail of a probe 22 to a preamplifier on the sensor board 13.

The process of using the embodiment to test a bare PWB is illustrated as follows: First, the BUT 5 is loaded on the bottom excitation plate 4 and positioned by positioning pins 23. Second, the x table 12 moves the BUT 5 until the BUT 5 is entirely covered by the top excitation plate 3. Then the z table 10 drives the probe assembly case 1 and automatically adjusts the air gap between the top excitation plate 3 and the BUT 5. After a desired air gap is obtained, a high frequency alternate current power source is switched to the excitation plates 3 and 4 which excite the conductors of the BUT 5 through the capacitive coupling between the conductors and the excitation plates 3 and 4. The x-y tables 11 and 12 then start to move the BUT 5 in a step-by-step and row-by-row scan sequence following a grid pattern[1] of the BUT 5. The maximum scan row length is equal to the distance which separates the probes 22 from each other in the two-dimensional array, and the scan row space is multiples of the grid size (i.e. unit length of the grid pattern). When the BUT 5 steps to the end of a scan row, the x table 12 moves the BUT 5 to the next scan row, then the y table 11 continues to move the BUT 5 step by step in the reverse direction through the next scan row. Since all the terminals are located at the scan rows or at the intersections of the grid pattern as recommended by the standards[2], each terminal will have a chance to be in alignment with a probe 22. When one or several terminals on the BUT 5 are momentarily in alignment with the probes 22, the corresponding solenoids 24 are powered, the probes 22 make contact with the terminals, and the signals from the terminals are sampled by the microcomputer-based data acquisition system. To realize this scanning and sampling process, the x-y coordinates of all the terminals of the BUT 5 are stored in the computer memory so that the microcomputer knows at any instance which terminals are in alignment with the probes 22 and, therefore, control the integrated solenoid-actuated probes 31 to sample signals from the terminals which are momentarily in alignment with the probes 22. After the signals are sampled, the solenoids 24 are de-energized and the probes 22 are raised by the springs 19 to release the contact with the BUT 5. This process continues until the signals from all of the terminals on the BUT 5 are sampled. Then the fixture 6 is withdrawn from the test area under the top excitation plate 3 to unload the BUT 5. For double-sided PWBs, the BUT 5 must be turned over to test the other side after the first side is tested to sample signals from all of the terminals on both sides of the BUT 5. But if a terminal, such as a plated through hole, can be tested from either side of the BUT 5, only one side of the terminal needs to be tested. It is noted that during this test process, each of the probes 22 needs only to sample signals from the terminals which are located in a small square area (one square inch) cornered by the adjacent probes. A terminal is defined as the end part (such as a land, a pad, a plated hole, or a test point) of a conductor with only one conductor entry. For example, a node is not a terminal if it has two conductor entries, even the two conductor entries are from different sides or layers of the BUT.

[1] A modular grid system to identify all holes, test points, lands, and overall board dimensions with modular units of length of 0.1, 0.05, 0.025, or other multiples of 0.005 inch in that order of preference.
[2] MIL-STD-275E, MIL-STD-2118, and IPC-D-300G.

The method of the fault detection is based on the following principle: Each conductor of the BUT has an inherent coupling capacitance with the excitation plates. Theoretically, the magnitude of signals sampled from a terminal of the BUT is proportional to the coupling capacitance between the terminal-connected conductor and the excitation plates. The coupling capacitance is in turn proportional to the effective coupling area between the conductor and the excitation plates. If the conductor has shorts or opens, the effective coupling area of the conductor changes so that the magnitude of the signals at the terminals of the conductor changes. Therefore, the magnitude of the signal sampled from a terminal of the conductor is an electric signature of the conductor which can be used for detecting shorts and opens of the conductor. All of the electric signatures of conductors of the BUT compose the electric signature of the BUT. This electric signature is compared with the electric signature of a known good PWB and the opens or shorts of the BUT can thus be detected by the comparison.

Figure 5:
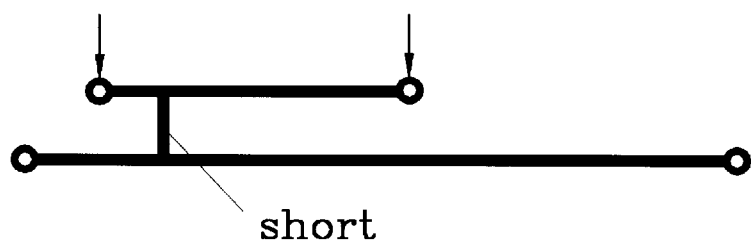
FIG. 5 shows two conductors connected by a short.
Figure 6:
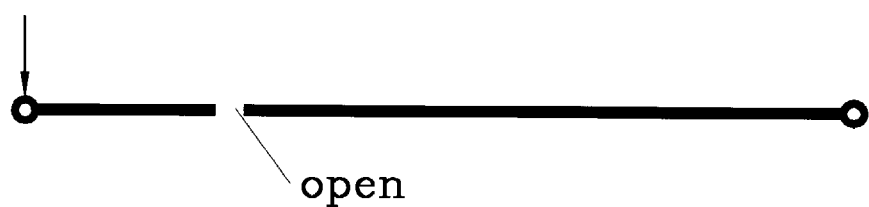
FIG. 6 shows a conductor divided by an open.

It is noted that the test process for detecting shorts and opens of a conductor (net) needs to sample signals from every terminals of the conductor (net) because shorts or opens of a conductor have significant effects on at least one terminal of the conductor but not on every terminals of the conductor. FIGS. 5 and 6 show two simple cases where a short and an open change the effective coupling area of the conductors. FIG. 5 shows two conductors connected by a short; FIG. 6 shows a conductor divided by an open. In these two cases, the short and the open only have significant effects on the terminals pointed by arrows. In fact, it can be concluded that the maximum variation in the effective coupling area of the conductors is greater than half of the effective coupling area of their original conductors. The similar conclusions can also be drawn from cases of double-sided or multi-layer PWBs and cases of conductors with branches. Therefore, a criterion which is implemented in the test process for detecting shorts and opens can be stated as follows:

A short or an open may exist in a conductor if the magnitude of the signals sampled from one of the terminals of the conductor is different from the magnitude of a known good PWB and the difference is greater than 50%.

The said difference is calculated as follows:

difference=|A−B|/B where

A is the magnitude of the sampled signal from a terminal on the BUT;

B is the magnitude of the sampled signal from the matched terminal on the known good PWB.

This is a conservative fault detecting criterion assuming that a short and an open do not concur near a terminal of a conductor, but the percentage value of the criterion can easily be modified to suit a particular application. Since this fault detecting method is based on the significant difference between the BUT and the known good PWB, it is not susceptible to the electric noise influence.

Since increasing the effective coupling area will increase the variation in the effective coupling area caused by shorts or opens, and since a large variation in the effective coupling area will result in a large variation in the magnitude of signals at the terminals during a test, it is therefore desired to increase the effective coupling area between the conductors and the excitation plates so as to increase the sensitivity of the tester to detect the faults. This illustrates the advantage of the embodiment using two excitation plates placed on both sides of the BUT to increase the effective coupling area.

If the BUT is a multi-layer board with ground and power planes, signals can also be injected into the ground and power planes which are used for internal excitation plates. If the BUT is a loaded board, AC or DC signals can be injected into the ground and power lines of the BUT directly without the necessity of using the external excitation plates. The test process of scanning and sampling for these different applications is similar to that described above, but the test points and the fault detecting criterion should be determined by the particular application.

In the test process of row by row scanning as described above, the scan rows are chosen in x direction, but they can also be chosen in y direction to reduce the total scan rows which depend on a particular type of the BUT.

In the embodiment shown in FIGS. 3 and 4 there are a total of 576 (24×24) solenoid-actuated probes 31 assembled on the top excitation plate 3 and the probes 22 are separated by one inch from each other in a two-dimensional array, but any other number of the probes 22 and separating dimensions may be used if desired.

In the embodiment shown in FIGS. 1, 2, and 3, only one integrated probe assembly 1 is used, but any other number of integrated probe assemblies can be used in a tester or a test system if desired.

In the embodiment shown in FIGS. 1 and 2, the probe assembly case 1 is hanged by the brace 9 which is driven by the z table 10 mounted on the frame 8 for adjusting air gap between the top excitation plate 3 and the BUT 5. If desired, the probe assembly case 1 can also be hinged with the frame 8 and be lifted up and lowered down by a rotary mechanism for loading and unloading BUT 5, and the air gap between the top excitation plate 3 and the BUT 5 can be set manually once for each type of PWBs.

In the embodiment shown in FIG. 3, the single sensor board 13 is mounted on the top of and in parallel with the ground plate 14 but, if desired, a small number of sensor boards 13 can be mounted on the top of and in perpendicular to the ground plate 13.

Although the present invention has been fully described by way of example with reference to the accompanying drawings, it is to be noted that various changes and modifications will be apparent to those skilled in the art. Therefore, unless otherwise such changes and modifications depart from the scope of the present invention, they should be constructed as being included therein.

What is claimed is:

1. A test apparatus for detecting shorts and opens of printed circuit board under test (BUT) comprising:

(a) At least two excitation plates, at least one of which includes perforation in two dimensional array, which are made of conductive material with dielectric coatings, connected to a high frequency power source, and placed on both sides of, in parallel and in close proximity to, the board under test (BUT) for injecting signals into the conductors of the BUT through a capacitive coupling between the excitation plates and the conductors of the BUT;

(b) A probe assembly including a large number of integrated solenoid-actuated probes which are mounted on one of the perforated excitation plates, arranged in a two dimensional array, separated evenly in x and y direction, and can be actuated simultaneously or independently to contact the conductors of the BUT through the small holes in the perforated excitation plate and to sample the signals from the conductors of the BUT; P1

(c) a test fixture mounted on a motorized x-y tables for loading the BUT and for scanning the integrated solenoid-actuated probes over the BUT to realize the test process of line by line scanning and sampling.

2. The test apparatus for detecting shorts and opens of printed circuit board under test (BUT) as claimed in claim 1 further including:

(a) at least one sensor board in close proximity to the integrated solenoid-actuated probes for signal processing and data acquisition;

(b) a ground plate mounted between the integrated solenoid-actuated probes and the sensor board as means to avoid electromagnetic interference between the excitation plate and the sensor board.

3. A test method for detecting shorts and opens of printed circuit board under test (BUT) including steps:

(a) Loading the BUT on the test fixture, between the two excitation plates, at least one of which has perforation in two dimensional array;

providing a solenoid activated probe assembly on one of the excitation plates (b) Using a z table which is mounted on the top of the solenoid-actuated probe assembly to adjust the air gap between the excitation plates and the BUT;

(c) connecting a high frequency power source to the excitation plates for injecting high frequency signals into the conductors of the BUT through the capacitance coupling between the excitation plates and the conductors of the BUT;

(d) Using motorized x-y tables to drive the test fixture and the BUT and to scan the integrated solenoid-actuated probes over the BUT in a line by line scanning sequence following the grid pattern of the BUT;

(e) Using a large number of integrated solenoid-actuated probes which are mounted on the perforated excitation plate to sample signals from the terminals of the BUT, which are momentarily in alignment with the probes, each of the probes only sampling signals from the terminals of the BUT in a small portion, cornered by the adjacent probes;

(f) Comparing the signals sampled from the terminals of the BUT with the signals of the known-good BUT and determining the shorts and opens of the BUT.

4. An arrangement of a test apparatus for detecting shorts and opens of printed circuit board under test (BUT) comprising:

(a) At least two excitation plates, at least one of which includes perforation in two dimensional array, which are made of conductive material with dielectric coatings, placed on both sides of, in parallel and in close proximity to, the BUT, and effectively form the capacitance coupling between the two excitation plates and the conductors of the BUT;

(b) a plurality of integrated solenoid-actuated probes mounted on one of the perforated excitation plates, arranged in a two dimensional array, separated evenly in x and y direction, said probes are operated simultaneously or independently to contact the conductors of the BUT through the small holes in the perforated excitation plate to contact the conductors of the BUT and sample signals from the conductors of the BUT; each of the integrated solenoid-actuated probes comprises a brass tube frame, an iron tube frame, a solenoid, a probe attached by an insulation ring and an iron ring for actuating the probe when the solenoid is powered, a plastic bearing for guiding the probe in reciprocating motion, and a spring for raising the probe when the solenoid is de-energized; and air chambers are formed in the brass tube frame and the iron tube frame so that the air in the chambers against the insulation ring and the iron ring damps the fast reciprocating motion of the probe, to prevent its rebound and to stabilize its contact against the BUT when it is actuated;

(c) A test fixture which is mounted on the motorized x-y tables for loading the BUT and for scanning the integrated solenoid-actuated probes over the BUT to realize the test process of line by line scanning and sampling.

* * * * *